United States Patent
Milesi et al.

[11] Patent Number: 6,127,818
[45] Date of Patent: Oct. 3, 2000

[54] TIGHTENING RINGS FOR INTEGRATED CIRCUIT TESTER HEADS

[75] Inventors: Roger Milesi, Saint Martin d'Uriage; Denis Noraz, Saint Nazaire les Eymes; Bernard Girolet, Grenoble; Jean-Michel Bailly, Allevard, all of France

[73] Assignee: SGS-Thomson Microelectronics S.A., Gentilly, France

[21] Appl. No.: 09/066,211

[22] Filed: Apr. 24, 1998

[30] Foreign Application Priority Data

Apr. 24, 1997 [FR] France .................................. 97 05317

[51] Int. Cl.⁷ .................................................. G01R 31/02
[52] U.S. Cl. ...................... 324/158.1; 324/754; 324/758
[58] Field of Search ................................. 324/158.1, 754, 324/758, 759, 761, 765, 755, 756

[56] References Cited

U.S. PATENT DOCUMENTS

| | | | |
|---|---|---|---|
| 3,866,119 | 2/1975 | Ardezzone et al. | 324/754 |
| 4,943,020 | 7/1990 | Beaucoup et al. | 248/124 |
| 4,973,015 | 11/1990 | Beaucoup et al. | 248/124 |
| 5,068,601 | 11/1991 | Parameter | 324/754 |
| 5,254,939 | 10/1993 | Anderson et al. | 324/754 |
| 5,517,126 | 5/1996 | Yamaguchi | 324/758 |
| 5,528,158 | 6/1996 | Sinsheimer et al. | 324/758 |
| 5,640,100 | 6/1997 | Yamagata et al. | 324/754 |
| 5,821,764 | 10/1998 | Slocum et al. | 324/758 |
| 5,828,225 | 10/1998 | Obikane et al. | 324/758 |
| 5,923,180 | 7/1999 | Botka et al. | 324/758 |

OTHER PUBLICATIONS

French Search Report from French Patent Application 97 05317, filed Apr. 24, 1997.
Patent Abstracts of Japan vol. 95, No. 8, Sep. 29, 1995 & JP–A–07 130800 (NEC).

*Primary Examiner*—Safet Metjahic
*Assistant Examiner*—T. R. Sundaram
*Attorney, Agent, or Firm*—Wolf, Greenfield & Sacks, P.C.; James H. Morris; Theodore E. Galanthay

[57] ABSTRACT

An assembly ring includes a collar for removable assembly of the ring on a test head. The assembly ring further includes a disk having an open central portion and meant for supporting a periphery of a wafer, which provides an interface of electrical contact transfer between a test head and a circuit to be tested. A rotatable connection including a ball bearing is provided between the disk and the collar.

7 Claims, 2 Drawing Sheets

TIGHTENING RINGS FOR INTEGRATED CIRCUIT TESTER HEADS

BACKGROUND OF THE INVENTION

1. Field of the Invention

The present invention relates to the field of integrated circuit testing devices. The present invention more specifically relates to an assembly ring for a contact transfer interface between a test head of a testing device and a conductive tip board itself transferring the contacts from the interface to an integrated circuit chip to be tested.

2. Discussion of the Related Art

FIG. 1 very schematically shows a conventional integrated circuit testing system.

A testing device generally includes a test head 1 connected, by wire links (not shown), to a programmable control system (not shown) that can generate test signals and process, in return, informations received from the test head.

Head 1 includes, in a free surface, directed to an integrated circuit 2 to be tested, contact making protruding rods 3. Rods 3 are meant to ensure an electric contact with a printed circuit wafer 4 forming an electric interface between rods 3 of head 1 and a tip board 5. Tips 5' and rods 5" are meant to transfer contacts from interface 4 to an integrated circuit chip 2.

The function of tip board 5 is to connect contacts (not shown) of an integrated circuit chip 2 with a given spacing, depending on the type of chip involved, to contacts (not shown) of a front surface of printed circuit wafer 4 which are not necessarily at the same spacing as the contacts of chip 2. Board 5 then generally includes deformable or supple tips 5' having great length.

The function of printed circuit wafer 4 is to transfer its front surface contacts to contacts of its rear surface which are located facing rods 3 of the test head.

The pattern of the rear surface contacts of wafer 4 thus depends on the test head while the pattern of the front surface contacts depends on the type of chip to be tested.

Generally, rods 3 of test head 1 and/or rods 5" of board 5 are telescopic and fitted with springs.

It should be noted that designations "front surface" and "rear surface" of wafer 4 are used here by mere convention and are not meant to be limiting. Wafer 4 is thus provided, on each of its surfaces, with conductive tracks and includes vias of contact transfer from one surface to the other.

The testing of integrated circuit chips is generally performed in batches on semiconductive wafers 6, for example made of silicon. The wafers are successively brought on a test plate 7 and the chips 2 of each wafer 6 are successively brought above tips 5' of board 5 to perform the testing of the concerned chip.

Generally, all test procedures, that is, both the generation and the processing of the electric signals, and the displacement of wafers 6 as well as the passing from a wafer to the next one in the same batch, are automated.

Rods 3 of the test head are generally distributed by blocks 8 at the periphery of the lower surface of the test head to face peripheral areas of wafer 4. Peripheral blocks 8 are generally used to carry low frequency signals (in particular, the supply signals), and additional rods (not shown) for carrying high frequency signals are generally provided in the central portion of the test head.

Since a test head is meant to test different types of chips, interface wafer 4 and tip board 5 are removable, and one wafer 4 and one tip board 5 are available for each type of chip 2.

A problem which arises in this type of testing device is associated with removably maintaining a given interface wafer 4 in position of association with the test head.

A ring 9 for tightening a wafer 4 against head 1 is generally used. Such a ring is generally formed by a generally cylinder-shaped collar, a lower edge 10 of which, directed towards its center, forms a support for the periphery of a wafer 4 positioned inside the collar. Opposite to edge 10, collar 9 comprises punctual protrusions 11 directed towards the inside. Protrusions 11 are meant to cooperate with cams 12 protruding from the external periphery of test head 1 to cause, by a rotating motion of ring 9, a blocking of wafer 4.

For the wafer to maintain a correct position with respect to rods 3 despite the rotating motion of ring 9, wafer 4 generally includes bores (not shown) for cooperating with the positioning rods (not shown) protruding from the lower surface of test head 1.

The distance separating test head 1 from wafer 4 is generally adjusted by means of shims 13 interposed between the rear surface of wafer 4 and the lower surface of head 1.

A problem which arises, upon assembly of a printed circuit wafer 4 on a test head 1, is that the tightening performed by means of ring 9 tends to cause a bending of wafer 4, as illustrated in FIG. 1. Such a deformation of wafer 4 risks breaking the conductive tracks of this wafer and risks bad contact with rods 3 of the test blocks, especially for high frequency contacts performed in the central portion of the wafer.

Further, the flexing of interface wafer 4 is transmitted to the connection between the front surface of wafer 4 and tip board 5.

FIGS. 2A and 2B partially show, respectively, in cross-sectional view associated with a wafer 4 and in top view, an assembly ring 9' according to a conventional solution to solve this problem of flexing of the interface wafer.

This solution consists of enlarging edge 10 supporting wafer 4 so that this edge extends to the center of the wafer, beyond above rods 3 of peripheral blocks 8 of test head 1. The assembly ring being generally a metal ring, isolating shims 14 are then provided on the internal surface of edge 10 to prevent an electric contact with tracks of the front surface of wafer 4.

A drawback of this solution is that the friction caused by the rotation of ring 9' upon assembly of a wafer 4 causes a quick wearing out of the interface wafer and damages its front surface conductive portions.

Another disadvantage of conventional tightening rings such as shown in FIGS. 1 and 2 is that the assembly of the ring on test head 1 requires the use of a tightening tool due to the friction between edge 10 and wafer 4 (FIG. 1) or to the friction between shims 14 and wafer 4 (FIG. 2).

SUMMARY OF THE INVENTION

The present invention aims at providing a novel assembly ring for an interface wafer on a test head which at least overcomes the drawbacks of the above conventional solutions.

The present invention also aims at providing an assembly ring which avoids any bending of the printed circuit wafer while extending its lifetime.

The present invention also aims at providing a novel ring which facilitates the assembly of a wafer on a test head.

The present invention aims, in particular, at providing an assembly ring which suppresses any friction between an interface wafer and the ring.

To achieve these and other objects, the present invention provides an assembly ring, on a test head, of a wafer that provides an interface of electric contact transfer between the test head and a circuit to be tested, including a disk, open in its central portion and meant for supporting the periphery of the wafer; a removable collar assembly of the ring on the test head; and means for rotatably connecting the disk in the vicinity of a free end of the collar.

According to an embodiment of the present invention, the rotatable connection means are formed of a ball bearing.

According to an embodiment of the present invention, the disk includes insulating pads for receiving the periphery of the wafer.

According to an embodiment of the present invention, the pads are formed by concentric rings attached to the upper surface of the disk.

According to an embodiment of the present invention, the wafer is a printed circuit wafer.

According to an embodiment of the present invention, the assembly ring is meant for a head for testing integrated circuit chips.

According to an embodiment of the present invention, the assembly ring is meant for an integrated circuit test head.

The present invention also aims at providing an integrated circuit testing device, of the type including a test head for receiving, removably, a printed circuit wafer that provides an interface of electric contact transfer between the test head and an integrated circuit to be tested, including a removable ring assembly on the test head such as hereabove.

The foregoing objects, features and advantages of the present invention will be discussed in detail in the following non-limiting description of specific embodiments made in connection with the accompanying drawings.

DETAILED DESCRIPTION

Figure 1:
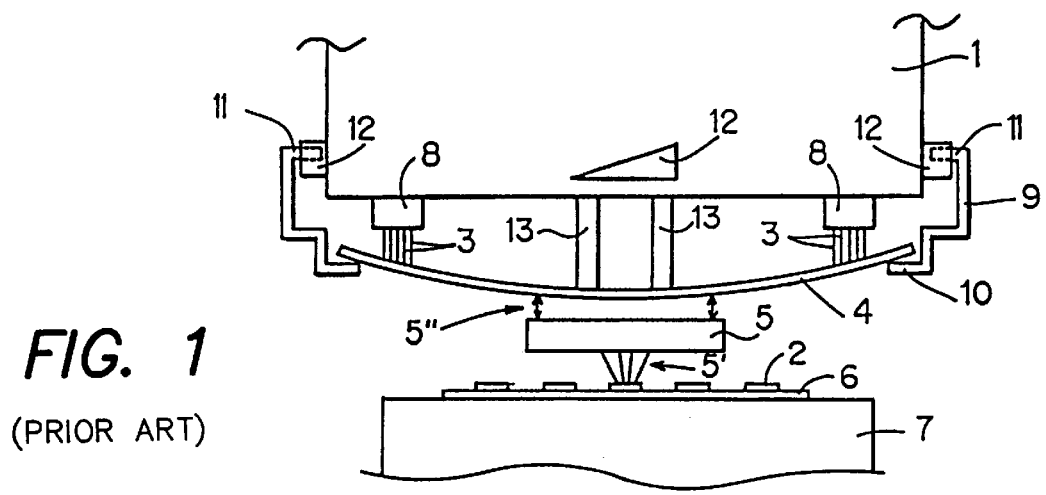
FIGS. 1, 2A, and 2B, previously described, are meant to show the state of the art and the problem to solve.

The same elements have been referred to with the same references in the different drawings. For clarity, the representations of the drawings are not to scale and only those elements necessary for the understanding of the present invention have been shown in the drawings and will be described hereafter.

A characteristic of the present invention is to implement assembly ring of an interface wafer for an integrated circuit chip test head in two portions rotatably connected to one another.

Figure 3A:
FIGS. 3A and 3B partially show, respectively in cross-sectional view and in top view, an embodiment of an assembly ring according to the present invention.
Figure 3B:
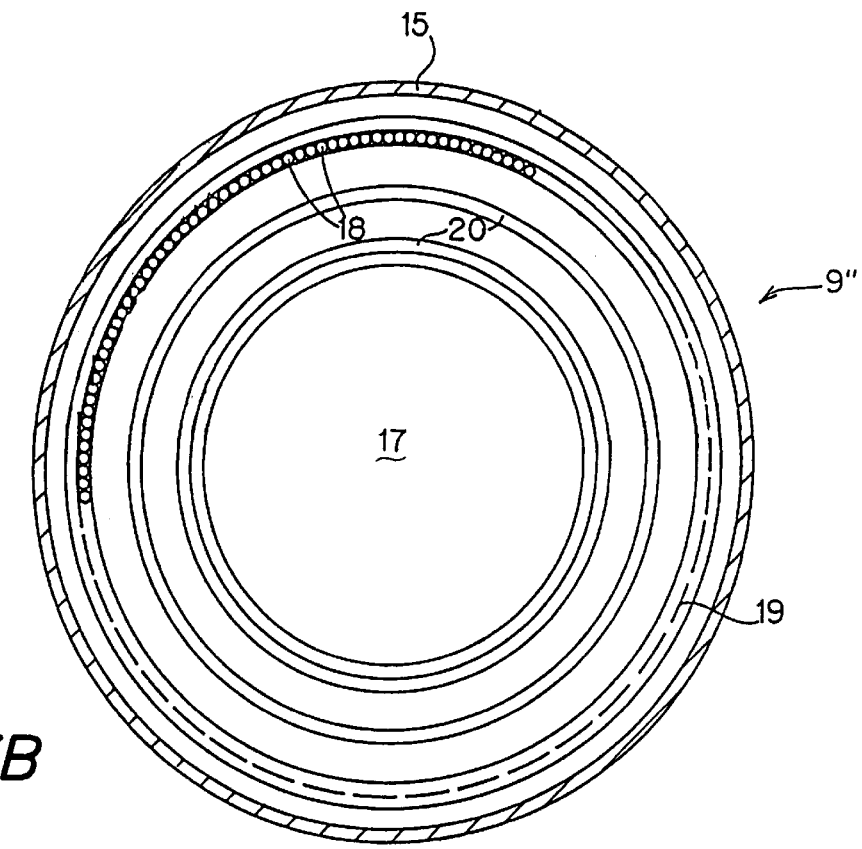

FIGS. 3A and 3B show, respectively in cross-sectional view and in top view, an assembly ring 9" according to an embodiment of the present invention.

Figure 2A:
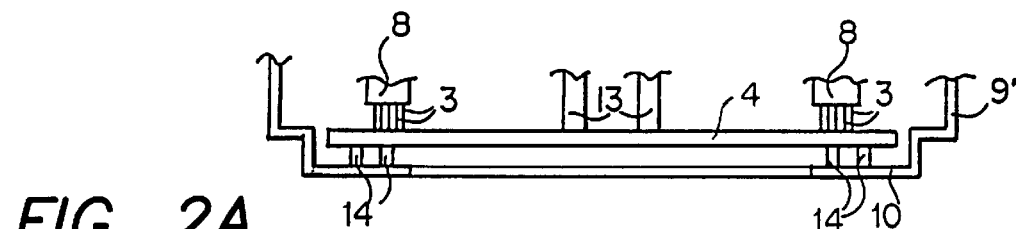
Figure 2B:
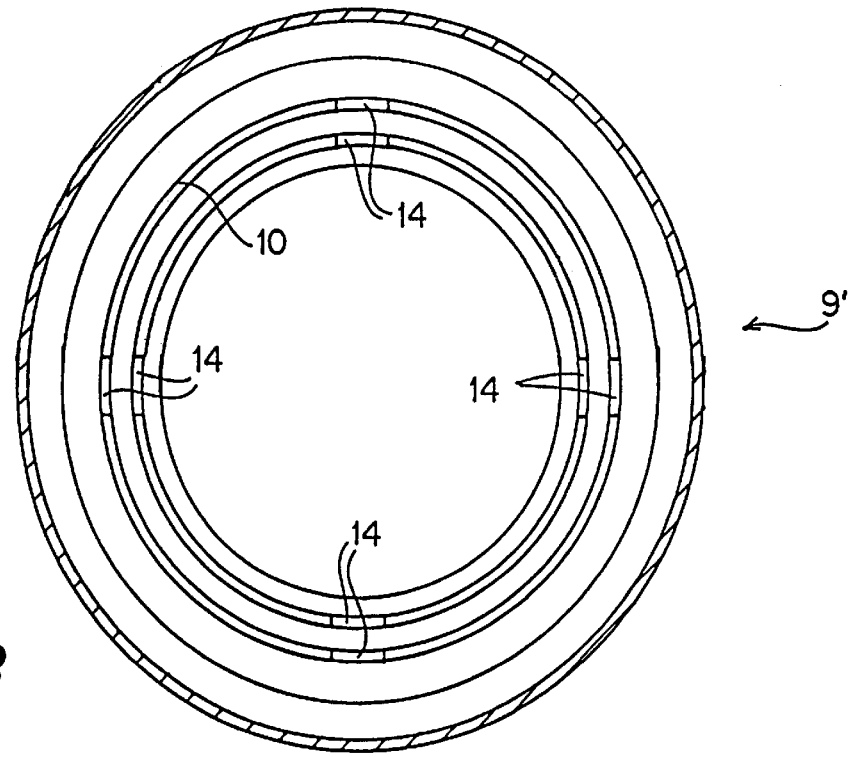

According to the present invention, ring 9" is formed by a collar 15 of substantially cylindrical general shape (partially shown in FIGS. 3A and 3B) and of a disk 16, open at its center and rotatably connected to collar 15. Disk 16 forms a surface for supporting the periphery of a printed circuit wafer 4 (FIGS. 1A and 2B) forming an interface between a test head (not shown) and a tip board for transferring contacts of a chip of a circuit to be tested.

The general shape of an assembly ring 9" according to the present invention is similar to that of a ring (9', FIG. 2A) of the second conventional example of implementation, to be able to adapt to an existing test head. Thus, the end of collar 15, opposite to perforated disk 16, is provided with internal protrusions (not shown in FIGS. 3A and 3B) for cooperating with cams of the test head to tighten the ring on the head by a rotating motion.

According to the present invention, the rotatable link between collar 15 and disk 16 is provided to generate as little friction as possible. In the embodiment shown, this link is provided by means of a ball bearing 18.

The ball race is circular and is, preferably, realized in a set-back 19 of the surface of collar 15 meant for receiving the external periphery of disk 16. A specific embodiment of the rotatable link of disk 16 to collar 15 will be described in relation with FIG. 4.

Collar 15 and disk 16 will preferably be made of metal, to give them a resistance adapted to the mechanical constraints that they undergo when associated with a test head. Pads 20, for example, insulating pads, meant to bear the printed circuit wafer, are preferably arranged in the upper surface of disk 16. These pads 20 are, preferably, circular and concentric (FIG. 3B) and are, for example, made of epoxy glass. Thus, pads 20 electrically insulate the printed circuit wafer from its support formed by disk 16, if the disk is made of metal.

Of course, the size of central opening 17 of disk 16 is sized so that the internal periphery of disk 16 extends, towards the center of the disk, beyond above the conductive rods (3, FIG. 1) of the peripheral blocks (8, FIG. 1) of the test head, in order to avoid any bending of the printed circuit wafer when assembled on the test head.

The assembly of an interface wafer is performed by positioning the wafer in ring 9", bringing ring 9" in a position of introduction between the cams of the test head and giving the ring a rotating motion to block it on the test head.

An advantage of the present invention is that, during the tightening of ring 9" which is performed by a rotation of collar 15, disk 16 supporting the interface wafer does not rotate thanks to ball bearing 18. Thus, any friction between the interface wafer and its support 16 is avoided.

Another advantage of the present invention is that by eliminating this friction, the assembly of the ring on the test head does not require the use of a tightening tool and can be performed manually.

Figure 4:
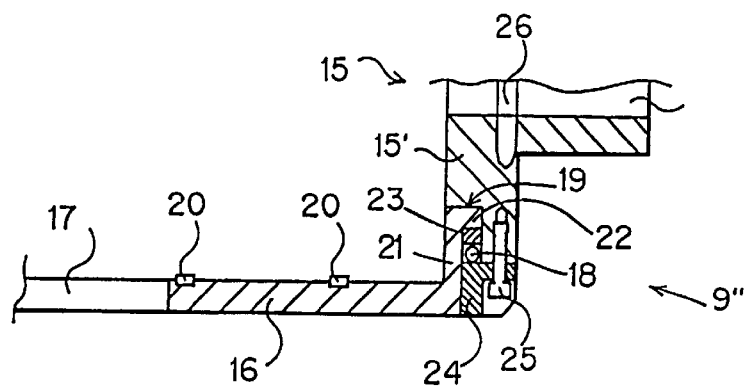
FIG. 4 is an enlarged view of a detail of an assembly ring such as shown in FIGS. 3A and 3B.

FIG. 4 shows, in cross-sectional view, a detail of an assembly ring 9" according to the present invention.

According to the embodiment shown, collar 15 comprises, in the vicinity of its free end of reception of disk 16, an internal set-back 19. This set-back 19 is meant to receive a peripheral edge 21 of disk 16, perpendicular to the disk plane and provided at its free end with a peripheral shouldering 22 directed to the outside. Edge 21 and its shoulder 22 engage in set-back 19 and shoulder 22 defines, with the free end of collar 15, a housing that receives a ball race 23 formed by a ring having an adapted section, for example, an L-shaped section. Balls 18 are arranged on ball race 23 which is closed by means of a ring 24 likely to be attached, for example, by means of screws 25, in the free end of collar 15. Ring 24 has, for example, a square-shaped cross-section, a first branch of which is provided with screw reception bores 25, and extends to edge 21 of disk 16 to enclose balls 18. A second branch of ring 24 is parallel to the edge of disk 16.

In the example shown in FIG. 4, collar 15 is formed by a first reception portion 15' of disk 16 and of a second portion 15" including the means of cam connection to the test head. The two portions are then assembled, for example, by threaded joint 26.

It should however be noted that the present invention applies whatever the shape and the mode of connection of the assembly ring to the test head. Indeed, the connection of disk 16 forming an interface wafer support is performed at the free end of the ring so that the implementation of the present invention, to rotatably connect a disk 16 to a collar 15 of an assembly ring, does not at all modify the rest of the assembly ring.

Thus, an advantage of the present invention is that it requires no modification of the test head. Further, in the case of an assembly ring conventionally formed of two portions, the ring portion, meant to be connected to test head 1, can be kept by adapting thereto a collar 15 associated with a disk 16 according to the present invention.

To adapt an assembly ring according to the present invention to existing test devices, it will however be provided that the bulk of the ball bearing is adapted accordingly.

Of course, the present invention is likely to have various alterations, modifications, and improvements which will readily occur to those skilled in the art. In particular, the ball bearing of rotatable connection of a disk to a collar according to the present invention can be replaced with any sliding connection means, provided that these means respect the described functionalities. Further, other materials than those indicated hereabove as an example can be used to implement the different elements that provide an assembly ring according to the present invention. Further, although the present invention has been described in relation with an integrated circuit chip testing system, it should be noted that the assembly ring according to the present invention can easily be transposed to a device of testing of bare or wired printed circuits, in which a wafer of interface between a test head and a contact transfer tip board is used.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An assembly ring, for use in supporting a wafer that provides an interface of electric contact transfer between a test head and a circuit to be tested, the assembly ring including:

a disk, having an open central portion and meant for supporting a periphery of the wafer;

a collar for removable assembly of the ring on the test head; and a rotatable connection between the disk and the collar, wherein the rotatable connection includes a ball bearing.

2. The assembly ring of claim 1, wherein the disk includes insulating pads for receiving the periphery of the wafer.

3. The assembly ring of claim 2, wherein the pads are formed by concentric rings attached to the upper surface of the disk.

4. The assembly ring of claim 1, wherein the wafer is a printed circuit wafer.

5. The assembly ring of claim 1, meant for a head for testing integrated circuit chips.

6. The assembly ring of claim 1, wherein the assembly ring is meant for an integrated circuit test head.

7. An integrated circuit testing device, of the type including a test head for receiving, removably, a printed circuit wafer that provides an interface of contact transfer between the test head and an integrated circuit to be tested, including a removable ring assembly on the test head of claim 1.

* * * * *